(12) United States Patent
Shappir

(10) Patent No.: US 8,053,812 B2
(45) Date of Patent: Nov. 8, 2011

(54) CONTACT IN PLANAR NROM TECHNOLOGY

(75) Inventor: Assaf Shappir, Kiryat Ono (IL)

(73) Assignee: Spansion Israel Ltd, Netanya (IL)

( * ) Notice: Subject to any disclaimer, the term of this patent is extended or adjusted under 35 U.S.C. 154(b) by 272 days.

(21) Appl. No.: 11/373,932

(22) Filed: Mar. 13, 2006

(65) Prior Publication Data

US 2006/0208281 A1  Sep. 21, 2006

Related U.S. Application Data

(60) Provisional application No. 60/662,386, filed on Mar. 17, 2005.

(51) Int. Cl.
*H01L 27/10* (2006.01)
(52) U.S. Cl. ........ 257/202; 257/315; 257/410; 257/322; 257/324; 257/774; 257/E29.064
(58) Field of Classification Search .................. 257/202, 257/315, 410, 322, 324, 774, E29.064
See application file for complete search history.

(56) References Cited

U.S. PATENT DOCUMENTS

| | | | |
|---|---|---|---|
| 3,881,180 A | 4/1975 | Gosney, Jr. | |
| 3,895,360 A | 7/1975 | Cricchi et al. | |
| 3,952,325 A | 4/1976 | Beale et al. | |
| 4,016,588 A | 4/1977 | Ohya et al. | |
| 4,017,888 A | 4/1977 | Christie et al. | |
| 4,145,703 A | 3/1979 | Blanchard et al. | |
| 4,151,021 A | 4/1979 | McElroy | |
| 4,173,766 A | 11/1979 | Hayes | |
| 4,173,791 A | 11/1979 | Bell | |
| 4,247,861 A | 1/1981 | Hsu et al. | |
| 4,257,832 A | 3/1981 | Schwabe et al. | |
| 4,281,397 A | 7/1981 | Neal et al. | |
| 4,306,353 A | 12/1981 | Jacobs et al. | |
| 4,342,102 A | 7/1982 | Puar | |
| 4,342,149 A | 8/1982 | Jacobs et al. | |
| 4,360,900 A | 11/1982 | Bate | |
| 4,373,248 A | 2/1983 | McElroy | |
| 4,380,057 A | 4/1983 | Kotecha et al. | |
| 4,385,533 A | 5/1983 | Collins | |
| 4,388,705 A | 6/1983 | Sheppard | |
| 4,389,705 A | 6/1983 | Sheppard | |

(Continued)

FOREIGN PATENT DOCUMENTS

EP  0 656 628  6/1995

(Continued)

OTHER PUBLICATIONS

U.S. Appl. No. 08/902,890, filed Jul. 30, 1997, Eitan.

(Continued)

*Primary Examiner* — Cuong Q Nguyen
*Assistant Examiner* — Tran Tran
(74) *Attorney, Agent, or Firm* — Eitan Mehulal Law Group

(57) ABSTRACT

A method for fabricating a non-volatile memory array includes placing contacts over bit lines in a self-aligned manner. The placing includes forming self-aligned contact holes bounded by a second insulating material resistant to the removal of a first insulating material previously deposited over the bit lines, and depositing contact material, wherein the second insulating material blocks effusion of the contact material beyond the contact holes. The distance between neighboring bit lines in the array does not include a margin for contact misalignment.

3 Claims, 8 Drawing Sheets

U.S. PATENT DOCUMENTS

| | | | |
|---|---|---|---|
| 4,404,747 A | 9/1983 | Collins | |
| 4,435,786 A | 3/1984 | Tickle | |
| 4,448,400 A | 5/1984 | Harari | |
| 4,471,373 A | 9/1984 | Shimizu et al. | |
| 4,494,016 A | 1/1985 | Ransom et al. | |
| 4,507,673 A | 3/1985 | Aoyama et al. | |
| 4,521,796 A | 6/1985 | Rajkanan et al. | |
| 4,527,257 A | 7/1985 | Cricchi | |
| 4,586,163 A | 4/1986 | Koike | |
| 4,613,956 A | 9/1986 | Paterson et al. | |
| 4,630,085 A | 12/1986 | Koyama | |
| 4,663,645 A | 5/1987 | Komori et al. | |
| 4,665,426 A | 5/1987 | Allen et al. | |
| 4,667,217 A | 5/1987 | Janning | |
| 4,672,409 A | 6/1987 | Takei et al. | |
| 4,725,984 A | 2/1988 | Ip et al. | |
| 4,733,105 A | 3/1988 | Shin et al. | |
| 4,742,491 A | 5/1988 | Liang et al. | |
| 4,758,869 A | 7/1988 | Eitan et al. | |
| 4,760,555 A | 7/1988 | Gelsomini et al. | |
| 4,761,764 A | 8/1988 | Watanabe | |
| 4,769,340 A | 9/1988 | Chang et al. | |
| 4,780,424 A | 10/1988 | Holler et al. | |
| 4,839,705 A | 6/1989 | Tigelaar et al. | |
| 4,847,808 A | 7/1989 | Kobatake | |
| 4,857,770 A | 8/1989 | Partovi et al. | |
| 4,870,470 A | 9/1989 | Bass, Jr. et al. | |
| 4,916,671 A | 4/1990 | Ichiguchi | |
| 4,941,028 A | 7/1990 | Chen et al. | |
| 4,961,010 A | 10/1990 | Davis | |
| 4,992,391 A | 2/1991 | Wang | |
| 5,021,999 A | 6/1991 | Kohda et al. | |
| 5,027,321 A | 6/1991 | Park | |
| 5,029,063 A | 7/1991 | Lingstaedt et al. | |
| 5,042,009 A | 8/1991 | Kazerounian et al. | |
| 5,075,245 A | 12/1991 | Woo et al. | |
| 5,081,371 A | 1/1992 | Wong | |
| 5,086,325 A | 2/1992 | Schumann et al. | |
| 5,094,968 A | 3/1992 | Schumann et al. | |
| 5,104,819 A | 4/1992 | Freiberger et al. | |
| 5,117,389 A | 5/1992 | Yiu | |
| 5,120,672 A | 6/1992 | Mitchell et al. | |
| 5,142,495 A | 8/1992 | Canepa | |
| 5,142,496 A | 8/1992 | Van Buskirk | |
| 5,159,570 A | 10/1992 | Mitchell et al. | |
| 5,168,334 A | 12/1992 | Mitchell et al. | |
| 5,172,338 A | 12/1992 | Mehrotra et al. | |
| 5,175,120 A | 12/1992 | Lee | |
| 5,204,835 A | 4/1993 | Eitan | |
| 5,214,303 A | 5/1993 | Aoki | |
| 5,237,213 A | 8/1993 | Tanoi | |
| 5,241,497 A | 8/1993 | Komarek | |
| 5,260,593 A | 11/1993 | Lee | |
| 5,268,861 A | 12/1993 | Hotta | |
| 5,276,646 A | 1/1994 | Kim et al. | |
| 5,280,420 A | 1/1994 | Rapp | |
| 5,289,412 A | 2/1994 | Frary et al. | |
| 5,293,563 A | 3/1994 | Ohta | |
| 5,295,092 A | 3/1994 | Hotta et al. | |
| 5,295,108 A | 3/1994 | Higa | |
| 5,305,262 A | 4/1994 | Yoneda | |
| 5,311,049 A | 5/1994 | Tsuruta | |
| 5,315,541 A | 5/1994 | Harari et al. | |
| 5,324,675 A | 6/1994 | Hayabuchi | |
| 5,334,555 A | 8/1994 | Sugiyama et al. | |
| 5,335,198 A | 8/1994 | Van Buskirk et al. | |
| 5,338,954 A | 8/1994 | Shimoji | |
| 5,345,425 A | 9/1994 | Shikatani | |
| 5,349,221 A | 9/1994 | Shimoji | |
| 5,350,710 A | 9/1994 | Hong et al. | |
| 5,352,620 A | 10/1994 | Komori et al. | |
| 5,357,134 A | 10/1994 | Shimoji | |
| 5,359,554 A | 10/1994 | Odake et al. | |
| 5,361,343 A | 11/1994 | Kosonocky et al. | |
| 5,366,915 A | 11/1994 | Kodama | |
| 5,375,094 A | 12/1994 | Naruke | |
| 5,381,374 A | 1/1995 | Shiraishi et al. | |
| 5,393,701 A | 2/1995 | Ko et al. | |
| 5,394,355 A | 2/1995 | Uramoto et al. | |
| 5,399,891 A | 3/1995 | Yiu et al. | |
| 5,400,286 A | 3/1995 | Chu et al. | |
| 5,402,374 A | 3/1995 | Tsuruta et al. | |
| 5,412,601 A | 5/1995 | Sawada et al. | |
| 5,414,693 A | 5/1995 | Ma et al. | |
| 5,418,176 A | 5/1995 | Yang et al. | |
| 5,418,743 A | 5/1995 | Tomioka et al. | |
| 5,422,844 A | 6/1995 | Wolstenholme et al. | |
| 5,424,567 A | 6/1995 | Chen | |
| 5,424,978 A | 6/1995 | Wada et al. | |
| 5,426,605 A | 6/1995 | Van Berkel et al. | |
| 5,434,825 A | 7/1995 | Harari | |
| 5,436,478 A | 7/1995 | Bergemont et al. | |
| 5,436,481 A | 7/1995 | Egawa et al. | |
| 5,440,505 A | 8/1995 | Fazio et al. | |
| 5,450,341 A | 9/1995 | Sawada et al. | |
| 5,450,354 A | 9/1995 | Sawada et al. | |
| 5,455,793 A | 10/1995 | Amin et al. | |
| 5,467,308 A | 11/1995 | Chang et al. | |
| 5,477,499 A | 12/1995 | Van Buskirk et al. | |
| 5,495,440 A | 2/1996 | Asakura | |
| 5,496,753 A | 3/1996 | Sakurai et al. | |
| 5,508,968 A | 4/1996 | Collins et al. | |
| 5,518,942 A | 5/1996 | Shrivastava | |
| 5,521,870 A | 5/1996 | Ishikawa | |
| 5,523,251 A | 6/1996 | Hong | |
| 5,523,972 A | 6/1996 | Rashid et al. | |
| 5,530,803 A | 6/1996 | Chang et al. | |
| 5,534,804 A | 7/1996 | Woo | |
| 5,537,358 A | 7/1996 | Fong | |
| 5,544,116 A | 8/1996 | Chao et al. | |
| 5,553,018 A | 9/1996 | Wang et al. | |
| 5,553,030 A | 9/1996 | Tedrow et al. | |
| 5,557,221 A | 9/1996 | Taguchi et al. | |
| 5,557,570 A | 9/1996 | Iwahashi | |
| 5,559,687 A | 9/1996 | Nicollini et al. | |
| 5,563,823 A | 10/1996 | Yiu et al. | |
| 5,568,085 A | 10/1996 | Eitan et al. | |
| 5,579,199 A | 11/1996 | Kawamura et al. | |
| 5,581,252 A | 12/1996 | Thomas | |
| 5,583,808 A | 12/1996 | Brahmbhatt | |
| 5,590,068 A | 12/1996 | Bergemont | |
| 5,590,074 A | 12/1996 | Akaogi et al. | |
| 5,592,417 A | 1/1997 | Mirabel | |
| 5,596,527 A | 1/1997 | Tomioka et al. | |
| 5,599,727 A | 2/1997 | Hakozaki et al. | |
| 5,600,586 A | 2/1997 | Lee et al. | |
| 5,606,523 A | 2/1997 | Mirabel | |
| 5,608,679 A | 3/1997 | Mi et al. | |
| 5,612,642 A | 3/1997 | McClinyock | |
| 5,617,357 A | 4/1997 | Haddad et al. | |
| 5,623,438 A | 4/1997 | Guritz et al. | |
| 5,627,790 A | 5/1997 | Golla et al. | |
| 5,633,603 A | 5/1997 | Lee | |
| 5,636,288 A | 6/1997 | Bonneville et al. | |
| 5,644,531 A | 7/1997 | Kuo et al. | |
| 5,654,568 A | 8/1997 | Nakao | |
| 5,656,513 A | 8/1997 | Wang et al. | |
| 5,657,332 A | 8/1997 | Auclair et al. | |
| 5,661,060 A | 8/1997 | Gill et al. | |
| 5,663,907 A | 9/1997 | Frayer et al. | |
| 5,672,959 A | 9/1997 | Der | |
| 5,675,280 A | 10/1997 | Nomura | |
| 5,677,867 A | 10/1997 | Hazani | |
| 5,677,869 A | 10/1997 | Fazio et al. | |
| 5,683,925 A | 11/1997 | Irani et al. | |
| 5,689,459 A | 11/1997 | Chang et al. | |
| 5,694,356 A | 12/1997 | Wong et al. | |
| 5,696,929 A | 12/1997 | Hasbun et al. | |
| 5,708,608 A | 1/1998 | Park et al. | |
| 5,712,814 A | 1/1998 | Fratin et al. | |
| 5,712,815 A | 1/1998 | Bill et al. | |
| 5,715,193 A | 2/1998 | Norman | |
| 5,717,581 A | 2/1998 | Canclini | |
| 5,717,632 A | 2/1998 | Richart et al. | |
| 5,717,635 A | 2/1998 | Akatsu | |
| 5,726,946 A | 3/1998 | Yamagata et al. | |
| 5,748,534 A | 5/1998 | Dunlap et al. | |

| | | | | | | |
|---|---|---|---|---|---|---|
| 5,751,037 | A | 5/1998 | Aozasa et al. | 6,040,610 | A | 3/2000 | Noguchi et al. |
| 5,751,637 | A | 5/1998 | Chen et al. | 6,044,019 | A | 3/2000 | Cernea et al. |
| 5,754,475 | A | 5/1998 | Bill et al. | 6,044,022 | A | 3/2000 | Nachumovsky |
| 5,760,445 | A | 6/1998 | Diaz | 6,063,666 | A | 5/2000 | Chang et al. |
| 5,760,634 | A | 6/1998 | Fu | 6,064,226 | A | 5/2000 | Earl |
| 5,768,192 | A | 6/1998 | Eitan | 6,064,251 | A | 5/2000 | Park |
| 5,768,193 | A | 6/1998 | Lee et al. | 6,064,591 | A | 5/2000 | Takeuchi et al. |
| 5,771,197 | A | 6/1998 | Kim | 6,074,916 | A | 6/2000 | Cappelletti |
| 5,774,395 | A | 6/1998 | Richart et al. | 6,075,402 | A | 6/2000 | Ghilardelli |
| 5,777,919 | A | 7/1998 | Chi-Yung et al. | 6,075,724 | A | 6/2000 | Li et al. |
| 5,781,476 | A | 7/1998 | Seki et al. | 6,078,518 | A | 6/2000 | Chevallier |
| 5,781,478 | A | 7/1998 | Takeuchi et al. | 6,081,456 | A | 6/2000 | Dadashev |
| 5,784,314 | A | 7/1998 | Sali et al. | 6,084,794 | A | 7/2000 | Lu et al. |
| 5,787,036 | A | 7/1998 | Okazawa | 6,091,640 | A | 7/2000 | Kawahara et al. |
| 5,793,079 | A | 8/1998 | Georgescu et al. | 6,094,095 | A | 7/2000 | Murray et al. |
| 5,801,076 | A | 9/1998 | Ghneim et al. | 6,097,639 | A | 8/2000 | Choi et al. |
| 5,805,500 | A | 9/1998 | Campardo et al. | 6,107,862 | A | 8/2000 | Mukainakano et al. |
| 5,808,506 | A | 9/1998 | Tran | 6,108,240 | A | 8/2000 | Lavi et al. |
| 5,812,449 | A | 9/1998 | Song | 6,108,241 | A | 8/2000 | Chevallier |
| 5,812,456 | A | 9/1998 | Hull et al. | 6,117,714 | A | 9/2000 | Beatty |
| 5,812,457 | A | 9/1998 | Arase | 6,118,207 | A | 9/2000 | Ormerod et al. |
| 5,815,435 | A | 9/1998 | Van Tran | 6,118,692 | A | 9/2000 | Banks |
| 5,822,256 | A | 10/1998 | Bauer et al. | 6,122,198 | A | 9/2000 | Haddad et al. |
| 5,825,683 | A | 10/1998 | Chang et al. | 6,128,226 | A | 10/2000 | Eitan et al. |
| 5,825,686 | A | 10/1998 | Schmitt-Landsiedel et al. | 6,128,227 | A | 10/2000 | Kim |
| 5,828,601 | A | 10/1998 | Hollmer et al. | 6,130,572 | A | 10/2000 | Ghilardelli et al. |
| 5,834,851 | A | 11/1998 | Ikeda et al. | 6,130,574 | A | 10/2000 | Bloch et al. |
| 5,835,935 | A | 11/1998 | Estakhri et al. | 6,133,095 | A | 10/2000 | Eitan et al. |
| 5,836,772 | A | 11/1998 | Chang et al. | 6,134,156 | A | 10/2000 | Eitan |
| 5,841,700 | A | 11/1998 | Chang | 6,137,718 | A | 10/2000 | Reisinger |
| 5,847,441 | A | 12/1998 | Cutter et al. | 6,147,904 | A | 11/2000 | Liron |
| 5,861,771 | A | 1/1999 | Matsuda et al. | 6,150,800 | A | 11/2000 | Kinoshita et al. |
| 5,862,076 | A | 1/1999 | Eitan | 6,154,081 | A | 11/2000 | Pakkala et al. |
| 5,864,164 | A | 1/1999 | Wen | 6,156,149 | A | 12/2000 | Cheung et al. |
| 5,867,429 | A | 2/1999 | Chen et al. | 6,157,242 | A | 12/2000 | Fukui |
| 5,870,334 | A | 2/1999 | Hemink et al. | 6,157,570 | A | 12/2000 | Nachumovsky |
| 5,870,335 | A | 2/1999 | Khan et al. | 6,163,048 | A | 12/2000 | Hirose et al. |
| 5,875,128 | A | 2/1999 | Ishizuka et al. | 6,163,484 | A | 12/2000 | Uekubo |
| 5,877,537 | A | 3/1999 | Aoki | 6,169,691 | B1 | 1/2001 | Pasotti et al. |
| 5,880,620 | A | 3/1999 | Gitlin et al. | 6,175,523 | B1 | 1/2001 | Yang et al. |
| 5,886,927 | A | 3/1999 | Takeuchi | 6,181,597 | B1 | 1/2001 | Nachumovsky |
| RE36,179 | E | 4/1999 | Shimoda | 6,181,605 | B1 | 1/2001 | Hollmer et al. |
| 5,892,710 | A | 4/1999 | Fazio et al. | 6,185,143 | B1 | 2/2001 | Perner et al. |
| 5,903,031 | A | 5/1999 | Yamada et al. | 6,188,211 | B1 | 2/2001 | Rincon-Mora et al. |
| 5,910,924 | A | 6/1999 | Tanaka et al. | 6,190,966 | B1 | 2/2001 | Ngo et al. |
| 5,920,503 | A | 7/1999 | Lee et al. | 6,192,445 | B1 | 2/2001 | Rezvani |
| 5,920,507 | A | 7/1999 | Takeuchi et al. | 6,195,196 | B1 | 2/2001 | Kimura et al. |
| 5,926,409 | A | 7/1999 | Engh et al. | 6,198,342 | B1 | 3/2001 | Kawai |
| 5,930,195 | A | 7/1999 | Komatsu et al. | 6,201,282 | B1 | 3/2001 | Eitan |
| 5,933,366 | A | 8/1999 | Yoshikawa | 6,201,737 | B1 | 3/2001 | Hollmer et al. |
| 5,933,367 | A | 8/1999 | Matsuo et al. | 6,205,056 | B1 | 3/2001 | Pan et al. |
| 5,936,888 | A | 8/1999 | Sugawara | 6,205,059 | B1 | 3/2001 | Gutala et al. |
| 5,940,332 | A | 8/1999 | Artieri | 6,208,200 | B1 | 3/2001 | Arakawa |
| 5,946,258 | A | 8/1999 | Evertt et al. | 6,208,557 | B1 | 3/2001 | Bergemont et al. |
| 5,946,558 | A | 8/1999 | Hsu | 6,214,666 | B1 | 4/2001 | Mehta |
| 5,949,714 | A | 9/1999 | Hemink et al. | 6,215,148 | B1 | 4/2001 | Eitan |
| 5,949,728 | A | 9/1999 | Liu et al. | 6,215,697 | B1 | 4/2001 | Lu et al. |
| 5,963,412 | A | 10/1999 | En | 6,215,702 | B1 | 4/2001 | Derhacobian et al. |
| 5,963,465 | A | 10/1999 | Eitan | 6,218,695 | B1 | 4/2001 | Nachumovsky |
| 5,966,603 | A | 10/1999 | Eitan | 6,219,277 | B1 | 4/2001 | Devin et al. |
| 5,969,989 | A | 10/1999 | Iwahashi | 6,219,290 | B1 | 4/2001 | Chang et al. |
| 5,969,993 | A | 10/1999 | Takeshima | 6,222,762 | B1 | 4/2001 | Guterman et al. |
| 5,973,373 | A | 10/1999 | Krautschneider et al. | 6,222,768 | B1 | 4/2001 | Hollmer et al. |
| 5,982,666 | A | 11/1999 | Campardo | 6,233,180 | B1 | 5/2001 | Eitan et al. |
| 5,986,940 | A | 11/1999 | Atsumi et al. | 6,240,032 | B1 | 5/2001 | Fukumoto |
| 5,990,526 | A | 11/1999 | Bez et al. | 6,240,040 | B1 | 5/2001 | Akaogi et al. |
| 5,991,202 | A | 11/1999 | Derhacobian et al. | 6,246,555 | B1 | 6/2001 | Tham |
| 5,999,444 | A | 12/1999 | Fujiwara et al. | 6,252,442 | B1 | 6/2001 | Malherbe |
| 5,999,494 | A | 12/1999 | Holzrichter | 6,252,799 | B1 | 6/2001 | Liu et al. |
| 6,000,006 | A | 12/1999 | Bruce et al. | 6,256,231 | B1 | 7/2001 | Lavi et al. |
| 6,005,423 | A | 12/1999 | Schultz | 6,261,904 | B1 | 7/2001 | Pham et al. |
| 6,011,725 | A | 1/2000 | Eitan | 6,265,268 | B1 | 7/2001 | Halliyal et al. |
| 6,018,186 | A | 1/2000 | Hsu | 6,266,281 | B1 | 7/2001 | Derhacobian et al. |
| 6,020,241 | A | 2/2000 | You et al. | 6,272,047 | B1 | 8/2001 | Mihnea et al. |
| 6,028,324 | A | 2/2000 | Su et al. | 6,275,414 | B1 | 8/2001 | Randolph et al. |
| 6,030,871 | A | 2/2000 | Eitan | 6,281,545 | B1 | 8/2001 | Liang et al. |
| 6,034,403 | A | 3/2000 | Wu | 6,282,133 | B1 | 8/2001 | Nakagawa et al. |
| 6,034,896 | A | 3/2000 | Ranaweera et al. | 6,282,145 | B1 | 8/2001 | Tran et al. |
| 6,037,627 | A | 3/2000 | Kitamura et al. | 6,285,246 | B1 | 9/2001 | Basu |

| Patent | Kind | Date | Inventor |
|---|---|---|---|
| 6,285,574 | B1 | 9/2001 | Eitan |
| 6,285,589 | B1 | 9/2001 | Kajitani |
| 6,285,614 | B1 | 9/2001 | Mulatti et al. |
| 6,292,394 | B1 | 9/2001 | Cohen et al. |
| 6,297,096 | B1 | 10/2001 | Boaz |
| 6,297,974 | B1 | 10/2001 | Ganesan et al. |
| 6,304,485 | B1 | 10/2001 | Harari et al. |
| 6,307,784 | B1 | 10/2001 | Hamilton et al. |
| 6,307,807 | B1 | 10/2001 | Sakui et al. |
| 6,320,786 | B1 | 11/2001 | Chang et al. |
| 6,324,094 | B1 | 11/2001 | Chevallier |
| 6,326,265 | B1 | 12/2001 | Liu et al. |
| 6,330,192 | B1 | 12/2001 | Ohba et al. |
| 6,331,950 | B1 | 12/2001 | Kuo et al. |
| 6,335,874 | B1 | 1/2002 | Eitan |
| 6,337,502 | B1 | 1/2002 | Eitan et al. |
| 6,339,556 | B1 | 1/2002 | Watanabe |
| 6,343,033 | B1 | 1/2002 | Parker |
| 6,346,442 | B1 | 2/2002 | Aloni et al. |
| 6,348,381 | B1 | 2/2002 | Jong |
| 6,348,711 | B1 | 2/2002 | Eitan |
| 6,351,415 | B1 | 2/2002 | Kushnarenko |
| 6,353,356 | B1 | 3/2002 | Liu |
| 6,353,554 | B1 | 3/2002 | Banks |
| 6,353,555 | B1 | 3/2002 | Jeong |
| 6,356,469 | B1 | 3/2002 | Roohparvar et al. |
| 6,359,501 | B2 | 3/2002 | Lin et al. |
| 6,374,337 | B1 | 4/2002 | Estakhri |
| 6,385,086 | B1 | 5/2002 | Mihara et al. |
| 6,396,741 | B1 | 5/2002 | Bloom et al. |
| 6,400,209 | B1 | 6/2002 | Matsuyama et al. |
| 6,400,607 | B1 | 6/2002 | Pasotti et al. |
| 6,407,537 | B2 | 6/2002 | Antheunis |
| 6,410,388 | B1 | 6/2002 | Kluth et al. |
| 6,417,081 | B1 | 7/2002 | Thurgate |
| 6,418,506 | B1 | 7/2002 | Pashley et al. |
| 6,426,898 | B1 | 7/2002 | Mihnea et al. |
| 6,429,063 | B1 | 8/2002 | Eitan |
| 6,433,624 | B1 | 8/2002 | Grossnikle et al. |
| 6,436,766 | B1 | 8/2002 | Rangarajan et al. |
| 6,436,768 | B1 | 8/2002 | Yang et al. |
| 6,438,031 | B1 | 8/2002 | Fastow |
| 6,438,035 | B2 | 8/2002 | Yamamoto et al. |
| 6,440,797 | B1 | 8/2002 | Wu et al. |
| 6,442,074 | B1 | 8/2002 | Hamilton et al. |
| 6,445,030 | B1 | 9/2002 | Wu et al. |
| 6,449,188 | B1 | 9/2002 | Fastow |
| 6,449,190 | B1 | 9/2002 | Bill |
| 6,452,438 | B1 | 9/2002 | Li |
| 6,456,528 | B1 | 9/2002 | Chen |
| 6,456,533 | B1 | 9/2002 | Hamilton et al. |
| 6,458,656 | B1 | 10/2002 | Park et al. |
| 6,458,677 | B1 | 10/2002 | Hopper et al. |
| 6,469,929 | B1 | 10/2002 | Kushnarenko et al. |
| 6,469,935 | B2 | 10/2002 | Hayashi |
| 6,472,706 | B2 | 10/2002 | Widdershoven et al. |
| 6,477,085 | B1 | 11/2002 | Kuo |
| 6,490,204 | B2 | 12/2002 | Bloom et al. |
| 6,496,414 | B2 | 12/2002 | Kasa et al. |
| 6,510,082 | B1 | 1/2003 | Le et al. |
| 6,512,701 | B1 | 1/2003 | Hamilton et al. |
| 6,519,180 | B2 | 2/2003 | Tran et al. |
| 6,519,182 | B1 | 2/2003 | Derhacobian et al. |
| 6,522,585 | B2 | 2/2003 | Pasternak |
| 6,525,969 | B1 | 2/2003 | Kurihara et al. |
| 6,528,390 | B2 | 3/2003 | Komori et al. |
| 6,529,412 | B1 | 3/2003 | Chen et al. |
| 6,532,173 | B2 | 3/2003 | Lioka et al. |
| 6,535,020 | B1 | 3/2003 | Yin |
| 6,535,434 | B2 | 3/2003 | Maayan et al. |
| 6,537,881 | B1 | 3/2003 | Rangarjan et al. |
| 6,538,270 | B1 | 3/2003 | Randolph et al. |
| 6,541,816 | B2 | 4/2003 | Ramsbey et al. |
| 6,552,387 | B1 | 4/2003 | Eitan |
| 6,555,436 | B2 | 4/2003 | Ramsbey et al. |
| 6,559,500 | B2 | 5/2003 | Torii |
| 6,562,683 | B1 | 5/2003 | Wang et al. |
| 6,566,194 | B1 | 5/2003 | Ramsbey et al. |
| 6,566,699 | B2 | 5/2003 | Eitan |
| 6,567,303 | B1 | 5/2003 | Hamilton et al. |
| 6,567,312 | B1 | 5/2003 | Torii et al. |
| 6,574,139 | B2 | 6/2003 | Kurihara |
| 6,577,514 | B2 | 6/2003 | Shor et al. |
| 6,577,532 | B1 | 6/2003 | Chevallier |
| 6,577,547 | B2 | 6/2003 | Ukon |
| 6,583,005 | B2 | 6/2003 | Hashimoto et al. |
| 6,583,479 | B1 | 6/2003 | Fastow et al. |
| 6,584,017 | B2 | 6/2003 | Maayan et al. |
| 6,590,811 | B1 | 7/2003 | Hamilton et al. |
| 6,593,606 | B1 | 7/2003 | Randolph et al. |
| 6,594,181 | B1 | 7/2003 | Yamada |
| 6,608,526 | B1 | 8/2003 | Sauer |
| 6,614,052 | B1 | 9/2003 | Zhang |
| 6,614,295 | B2 | 9/2003 | Tsuchi |
| 6,614,686 | B1 | 9/2003 | Kawamura |
| 6,614,692 | B2 | 9/2003 | Maayan et al. |
| 6,617,179 | B1 | 9/2003 | Kim |
| 6,617,215 | B1 | 9/2003 | Halliyal et al. |
| 6,618,290 | B1 | 9/2003 | Wang et al. |
| 6,624,672 | B2 | 9/2003 | Confaloneri et al. |
| 6,627,555 | B2 | 9/2003 | Eitan et al. |
| 6,630,384 | B1 | 10/2003 | Sun et al. |
| 6,633,496 | B2 | 10/2003 | Maayan et al. |
| 6,633,499 | B1 | 10/2003 | Eitan et al. |
| 6,633,956 | B1 | 10/2003 | Mitani |
| 6,636,440 | B2 | 10/2003 | Maayan et al. |
| 6,639,271 | B1 | 10/2003 | Zheng et al. |
| 6,639,837 | B2 | 10/2003 | Takano et al. |
| 6,639,844 | B1 | 10/2003 | Liu et al. |
| 6,639,849 | B2 | 10/2003 | Takahashi et al. |
| 6,642,148 | B1 | 11/2003 | Ghandehari et al. |
| 6,642,573 | B1 | 11/2003 | Halliyal et al. |
| 6,642,586 | B2 | 11/2003 | Takahashi |
| 6,643,170 | B2 | 11/2003 | Huang et al. |
| 6,643,177 | B1 | 11/2003 | Le et al. |
| 6,643,178 | B2 | 11/2003 | Kurihara |
| 6,643,181 | B2 | 11/2003 | Sofer et al. |
| 6,645,801 | B1 | 11/2003 | Ramsbey et al. |
| 6,649,972 | B2 | 11/2003 | Eitan |
| 6,650,568 | B2 | 11/2003 | Iijima |
| 6,653,190 | B1 | 11/2003 | Yang et al. |
| 6,653,191 | B1 | 11/2003 | Yang et al. |
| 6,654,296 | B2 | 11/2003 | Jang et al. |
| 6,664,588 | B2 | 12/2003 | Eitan |
| 6,665,769 | B2 | 12/2003 | Cohen et al. |
| 6,670,241 | B1 | 12/2003 | Kamal et al. |
| 6,670,669 | B1 | 12/2003 | Kawamura |
| 6,674,138 | B1 | 1/2004 | Halliyal et al. |
| 6,677,805 | B2 | 1/2004 | Shor et al. |
| 6,680,509 | B1 | 1/2004 | Wu et al. |
| 6,686,242 | B2 | 2/2004 | Willer et al. |
| 6,690,602 | B1 | 2/2004 | Le et al. |
| 6,700,818 | B2 | 3/2004 | Shappir et al. |
| 6,717,207 | B2 | 4/2004 | Kato |
| 6,723,518 | B2 | 4/2004 | Papsidero et al. |
| 6,731,542 | B1 | 5/2004 | Le et al. |
| 6,738,289 | B2 | 5/2004 | Gongwer et al. |
| 6,744,692 | B2 | 6/2004 | Shiota et al. |
| 6,765,259 | B2 | 7/2004 | Kim |
| 6,768,165 | B1 | 7/2004 | Eitan |
| 6,788,579 | B2 | 9/2004 | Gregori et al. |
| 6,791,396 | B2 | 9/2004 | Shor et al. |
| 6,794,249 | B2 | 9/2004 | Palm et al. |
| 6,831,872 | B2 | 12/2004 | Matsuoka |
| 6,836,431 | B2 | 12/2004 | Chang |
| 6,871,258 | B2 | 3/2005 | Micheloni et al. |
| 6,885,585 | B2 | 4/2005 | Maayan et al. |
| 6,912,160 | B2 | 6/2005 | Yamada |
| 6,917,544 | B2 | 7/2005 | Maayan et al. |
| 6,928,001 | B2 | 8/2005 | Avni et al. |
| 6,937,523 | B2 | 8/2005 | Eshel |
| 6,967,872 | B2 | 11/2005 | Quader et al. |
| 6,996,692 | B2 | 2/2006 | Kouno |
| 7,079,420 | B2 | 7/2006 | Shappir et al. |
| 2001/0006477 | A1 | 7/2001 | Banks |
| 2002/0004878 | A1 | 1/2002 | Norman |
| 2002/0004921 | A1 | 1/2002 | Muranaka et al. |
| 2002/0064911 | A1 | 5/2002 | Eitan |

| | | | | | | |
|---|---|---|---|---|---|---|
| 2002/0132436 | A1 | 9/2002 | Eliyahu et al. | JP | 2001-085646 | 3/2001 |
| 2002/0140109 | A1 | 10/2002 | Keshavarzi et al. | JP | 2001-118392 | 4/2001 |
| 2002/0145465 | A1 | 10/2002 | Shor et al. | JP | 2001-156189 | 6/2001 |
| 2002/0191465 | A1 | 12/2002 | Maayan et al. | JP | 2002-216488 | 8/2002 |
| 2002/0199065 | A1 | 12/2002 | Subramoney et al. | JP | 3358663 | 10/2002 |
| 2003/0001213 | A1 | 1/2003 | Lai | WO | WO 81/00790 | 3/1981 |
| 2003/0021155 | A1 | 1/2003 | Yachareni et al. | WO | WO 96/15553 | 5/1996 |
| 2003/0072192 | A1 | 4/2003 | Bloom et al. | WO | WO 96/25741 | 8/1996 |
| 2003/0076710 | A1 | 4/2003 | Sofer et al. | WO | WO 98/03977 | 1/1998 |
| 2003/0117841 | A1 | 6/2003 | Yamashita | WO | WO 99/31670 | 6/1999 |
| 2003/0131186 | A1 | 7/2003 | Buhr | WO | WO 99/57728 | 11/1999 |
| 2003/0134476 | A1 | 7/2003 | Roizin et al. | WO | WO 00/46808 | 8/2000 |
| 2003/0142544 | A1 | 7/2003 | Maayan et al. | WO | WO 01/65566 | 9/2001 |
| 2003/0145176 | A1 | 7/2003 | Dvir et al. | WO | WO 01/65567 | 9/2001 |
| 2003/0145188 | A1 | 7/2003 | Cohen et al. | WO | WO 01/84552 | 11/2001 |
| 2003/0155659 | A1 | 8/2003 | Verma et al. | WO | WO 02/43073 | 5/2002 |
| 2003/0189233 | A1 * | 10/2003 | Yamashita .................... 257/410 | WO | WO 03/032393 | 4/2003 |
| 2003/0190786 | A1 | 10/2003 | Ramsbey et al. | WO | WO 03/036651 | 5/2003 |
| 2003/0197221 | A1 | 10/2003 | Shinozaki et al. | WO | WO 03/054964 | 7/2003 |
| 2003/0202411 | A1 | 10/2003 | Yamada | WO | WO 03/063167 | 7/2003 |
| 2003/0206435 | A1 | 11/2003 | Takahashi | WO | WO 03/063168 | 7/2003 |
| 2003/0208663 | A1 | 11/2003 | Van Buskirk et al. | WO | WO 03/079370 | 9/2003 |
| 2003/0209767 | A1 | 11/2003 | Takahashi et al. | WO | WO 03/079446 | 9/2003 |
| 2003/0214844 | A1 | 11/2003 | Iijima | WO | WO 03/083916 | 10/2003 |
| 2003/0218207 | A1 | 11/2003 | Hashimoto et al. | WO | WO 03/088258 | 10/2003 |
| 2003/0218913 | A1 | 11/2003 | Le et al. | WO | WO 03/088259 | 10/2003 |
| 2003/0222303 | A1 | 12/2003 | Fukuda et al. | WO | WO 03/088260 | 10/2003 |
| 2003/0227796 | A1 | 12/2003 | Miki et al. | WO | WO 03/088261 | 10/2003 |
| 2004/0012993 | A1 | 1/2004 | Kurihara | WO | WO 03/088353 | 10/2003 |
| 2004/0013000 | A1 | 1/2004 | Torii | WO | WO 03/100790 | 12/2003 |
| 2004/0014290 | A1 | 1/2004 | Yang et al. | WO | WO 2004038728 A1 * | 5/2004 |
| 2004/0021172 | A1 | 2/2004 | Zheng et al. | | | |
| 2004/0027858 | A1 | 2/2004 | Takahashi et al. | | | |
| 2004/0151034 | A1 | 8/2004 | Shor et al. | | | |
| 2004/0153621 | A1 | 8/2004 | Polansky et al. | | | |
| 2004/0157393 | A1 | 8/2004 | Hwang | | | |
| 2004/0222437 | A1 | 11/2004 | Avni et al. | | | |
| 2005/0117395 | A1 | 6/2005 | Maayan et al. | | | |
| 2005/0140405 | A1 | 6/2005 | Do et al. | | | |
| 2006/0084219 | A1 | 4/2006 | Lusky et al. | | | |

FOREIGN PATENT DOCUMENTS

| | | |
|---|---|---|
| EP | 0751560 | 6/1995 |
| EP | 0693781 | 1/1996 |
| EP | 0 822 557 | 2/1998 |
| EP | 0 843 398 | 5/1998 |
| EP | 0580467 | 9/1998 |
| EP | 0461764 | 7/2000 |
| EP | 1 071 096 | 1/2001 |
| EP | 1073120 | 1/2001 |
| EP | 1 091 418 | 4/2001 |
| EP | 1126468 | 8/2001 |
| EP | 0740307 | 12/2001 |
| EP | 1164597 | 12/2001 |
| EP | 1 207 552 | 5/2002 |
| EP | 1 223 586 | 7/2002 |
| EP | 1 365 452 | 11/2003 |
| EP | 001217744 | 3/2004 |
| GB | 1297899 | 11/1972 |
| GB | 2157489 | 3/1985 |
| JP | 54-053929 | 4/1979 |
| JP | 60-200566 | 10/1985 |
| JP | 60201594 | 10/1985 |
| JP | 63-249375 | 10/1988 |
| JP | 3-285358 | 12/1991 |
| JP | 04-226071 | 8/1992 |
| JP | 04-291962 | 10/1992 |
| JP | 05021758 | 1/1993 |
| JP | 06151833 | 5/1994 |
| JP | 06-232416 | 8/1994 |
| JP | 07193151 | 7/1995 |
| JP | 08-106791 | 4/1996 |
| JP | 08-297988 | 11/1996 |
| JP | 09-017981 | 1/1997 |
| JP | 09162314 | 6/1997 |
| JP | 10-106276 | 4/1998 |
| JP | 10 334676 | 12/1998 |
| JP | 11-162182 | 6/1999 |
| JP | 11-354758 | 12/1999 |

OTHER PUBLICATIONS

Bude et al., EEPROM/Flash Sub 3.0V drain—Source Bias Hot Carrier Writing, IEDM, 1995, pp. 989-992.

Bude et al., Secondary Electron Flash—a High Performance, Low Power Flash Technology for 0.35 um and below, IEDM, 1997, 279-282.

Bude et al., Modeling Nonequilibrium Hot Carrier Device Effects, Conference of Insulator Specialists of Europe, Jun. 1997, Sweden.

Jung et al., IEEE Journal of Solid-State Circuits, Nov. 1996, 1575-1583, vol. 31, No. 11.

Campardo et al., IEEE Journal of Solid-State Circuits, Nov. 2000, 1655-1667, vol. 35, No. 11.

Lin et al., Novel Source-Controlled Self-Verified Programming for Multilevel EEPROM's, IEEE Transactions on Electron Devices, Jun. 2000, 1166-1174, vol. 47, No. 6.

Chan et al., A True Single-Transistor Oxide-Nitride-Oxide EEPROM Device, IEEE Electron Device Letters, Mar. 1987, vol. EDL-8, No. 3.

Eitan et al., "Hot-Electron Injection into the Oxide in n-Channel MOS Devices", IEEE Transactions on Electron Devices, vol. ED-28, No. 3, pp. 328-370, Mar. 1981.

Roy Anirban, "Characterization and Modeling of Charge Trapping and Retention in Novel Multi-Dielectric Nonvolatile Semiconductor Memory Devices", Microelectronics Laboratory, Sherman Fairchild Center, Department of Computer Science and Electrical Engineering, Bethlehem, Pennsylvania, p. 1-35, 1989.

Ma et al., A Dual-bit Split-Gate EEPROM (DSG) Cell in Contactless Array for Single-Vcc High Density Flash Memories, IEEE, 1994, 57-60.

Oshima et al., Process and Device Technologies for 16Mbit EPROMs with Large-Tilt-Angle Implanted P-Pocket Cell, IEEE, Dec. 1990, Ch. 2865-4/90/0000-0095, pp. 521-524, San Francisco, California.

Lee, A new approach for the floating-gate MOS nonvolatile memory, Applied Physics Letters, Oct. 1977, 475-476, vol. 31, No. 7, American Institute of Physics.

Glasser et al., MOS Device Electronics, The Design and Analysis of VLSI Circuits, Chapter 2, 67-163, 1998, Addison-Wesley Publishing Company.

Bhattacharyya et al., FET Gate Structure for Nonvolatile N-Channel Read-Mostly Memory Device, IBM Technical Disclosure Bulletin, Nov. 1975, 1768, vol. 18, No. 6.

Ricco et al., Nonvolatile Multilevel Memories for Digital Applications, Dec. 1998, 2399-2421, vol. 86, No. 12, Institute of Electrical and Electronics Engineers, Inc.

Martin, Improved Circuits for the Realization of Switched-Capacitor Filters, IEEE Transactions on Circuits and Systems, Apr. 1980, 237-244, vol. CAS-27.

Tseng et al., "Thin CVD Stacked Gate Dielectric for ULSI Technology", IEEE, pp. 321-214; 1993, 13.1.1-13.1.4.

Pickar, Ion Implementation is Silicon—Physics, Processing, and Microelectronic Devices, Applied Solid State Science, 1975, 151-241, vol. 5, Academic Press.

2 Bit/Cell EEPROM Cell Using Band-to-Band Tunneling for Data Read-Out, IBM Technical Disclosure Bulletin, 1992, 136-140, vol. 35 No. 4B.

Umezawa et al., A 5-V-Only Operation 0.6-μm Flash EEPROM with Row Decoder Scheme in Triple-Well Structure, IEEE Journal of Solid-State Circuits, 1992, 1540, vol. 27.

Mitchell et al., A new self-aligned planar array cell for ultra high density EPROMS, 1987.

Esquivel et al., High Density Contactless, Self Aligned EPROM Cell Array Technology, 1986.

Johns, Martin, Analog Integrated Circuit Design, Jun. 1, 1997, Chapter 10, John Wiley and Sons Inc.

Allen et al., CMOS Analog Circuit Design, 2002, 259 pages, Oxford University Press.

Klinke et al., A very-high-slew-rate CMOS operational amplifier, IEEE Journal of Solid-State Circuits, 1989, 744-746, 24 Vol.

Shor et al, paper WA2.04.01—Self regulated Four phased charge pump with boosted wells, ISCAS 2002.

Fotouhi, An efficient CMOS line driver for 1.544-Mb/s T1 and 2.048-Mb/s E1 applications, IEEE Journal of Solid-State Circuits, 2003, 226-236pages, 38vol.

P-N Junction Diode, Physics of semiconductor devices, 1981, Ch. 2, "A Wiley-Interscience Publication", John Wiley & Sons Publishers.

Chang, Non Volatile Semiconductor Memory Devices, Proceedings of the IEEE, 64 vol., No. 7, pp. 1039-1059; Jul. 1976.

Yoon, Sukyoon, et al., A Novel Substrate Hot Electron and Hole Injection Structure with a double-implanted buried-channel MOSFET, IEEE Transactions on Electron Devices, Dec. 1991, p. 2722, vol. 38, No. 12.

4 Bits of Digital Data Fit in a Single Cell, Technology Newsletter, Electronic Design, Apr. 1, 1996.

M. Specht et al, Novel Dual Bit Tri-Gate Charge Trapping Memory Devices, IEEE Electron Device Letters, vol. 25, No. 12, Dec. 2004, pp. 810-812.

Bu, Jiankang et al., "Design Considerations in Scaled SONOS Nonvolatile Memory Devices" Lehigh University, Bethlehem, PA, Power Point Presentation, pp. 1-24, 2000; http://klabs.org/richcontent/MemoryContent/nvmt_symp/nvmts_2000/presentations/bu_white_sonos_lehigh_univ.pdf.

Adams et al., "SONOS Nonvolatile Semiconductor Memories for Space and Military Applications", Symposium, 2000. http://klabs.org/richcontent/MemoryContent/nvmt_symp/nvmts_2000/papers/adams_d.pdf.

"Philips Research—Technologies-Embedded Nonvolatile Memories" http://research.philips.com/technologies/ics/nvmemories/index.html.

"Semiconductor Memory: Non-Volatile Memory (NVM)", National University of Singapore, Department of Electrical and Computer Engineering: http://ece.nus.edu.sg/stfpage/elezhucx/myweb/NVM.pdf.

"Saifun Non-Volatile Memory Technology", 1st Edition, 2005, published and written by Saifun Semiconductors Ltd., 1110 pgs.

* cited by examiner

CONTACT IN PLANAR NROM TECHNOLOGY

CROSS-REFERENCE TO RELATED APPLICATIONS

This application claims benefit from U.S. Provisional Patent Application No. 60/562,386, filed Mar. 17, 2005, which application is hereby incorporated by reference.

FIELD OF THE INVENTION

The present invention relates to nitride read only memory (NROM) cells generally and to contacts in planar NROM cells in particular.

BACKGROUND OF THE INVENTION

Nitride read only memory (NROM) arrays are known in the art, and are described in many patents. U.S. patent application Ser. No. 11/247,733 for example, assigned to the common assignee of the present invention, and whose disclosure is incorporated herein by reference, describes a dense planar virtual ground (VG) NROM array, composed of double polysilicon planar NROM cells. FIG. 1, reference to which is now made, shows a schematic top view of an exemplary dense planar VG array 10.

The virtual ground array architecture, as shown in FIG. 1, consists of a dense crisscrossing of word lines 19 and bit lines 22. Due to the high resistance of bit lines 22, contacts 26, which are connected to highly conductive metal lines, are employed to convey charge along bit lines when the distance the charge must travel is long. In a planar VG NROM array such as array 10, contacts 26 are typically located every 16 to 32 word lines.

Sufficient horizontal margins Mh and vertical margins Mv must be maintained between each contact 26 and the bit lines and word lines adjacent to it in order to ensure reliable operation of array 10. As further shown in FIG. 1, both margins Mh and Mv are affected when a contact, such as exemplary contact 26*j*, does not land squarely on its intended bit line location Lj during manufacture.

In the example shown in FIG. 1, where exemplary contact 26*j* lands below and to the right of location Lj, instead of directly on location Lj, margin $Mv_t$, between the top edge of contact 26*j* and adjacent word line 19*t* increases to a length of $Mv_{tj}$. Margin $Mv_b$, between the bottom edge of contact 26*j* and adjacent word line 19*b* decreases to a length of $Mv_{bj}$. Laterally, margin Mh, between the rightmost edge of contact 26*j* and adjacent bit line 22*r* decreases to a length of $Mh_j$.

Misalignments between a contact 26 and a bit line 22 such as that exemplified by contact 26*j* in FIG. 1, result in a reduction of the distance between bit lines, due to doping of the substrate at the contact landing point. Thus leakage between bit lines becomes a serious problem.

Implementation of shallow trenchline isolation (STI) which is known in the art, between bit lines at the contact region, is a straightforward solution which can address the leakage between bit lines. However, the drawbacks of this solution include the complication of the manufacturing process and the possible requirement of additional horizontal and vertical margins, which carries a substantial die size penalty.

SUMMARY OF THE PRESENT INVENTION

There is therefore provided, in accordance with a preferred embodiment of the present invention, a method for fabricating a non-volatile memory array. The method includes placing contacts over bit lines in a self-aligned manner.

Additionally, in accordance with a preferred embodiment of the present invention, the placing of the contacts includes forming self-aligned contact holes bounded by a second insulating material resistant to the removal of a first insulating material previously deposited over the bit lines and depositing contact material, wherein the second insulating material blocks effusion of the contact material beyond the contact holes.

Moreover, in accordance with a preferred embodiment of the present invention, the forming of the self-aligned contact holes includes having column-like formations of a first insulating material previously deposited over the bit lines, placing at least a layer of a second insulating material resistant to the removal of the first insulating material in the spaces between the formations, at least along the exposed side surfaces of the first insulating material, and removing the first insulating material to expose at least a portion of each of the bit lines.

Further, in accordance with a preferred embodiment of the present invention, the placing of at least a layer of a second insulating material includes filling the spaces between the formations of the first insulating material with the second insulating material.

Still further, in accordance with a preferred embodiment of the present invention, the removing of the first insulating material employs a removing substance to which the second insulating material is resistant.

Moreover, in accordance with a preferred embodiment of the present invention, the removing substance is an etchant.

Still further, in accordance with a preferred embodiment of the present invention, the filling of the spaces between the formations of the first insulating material with the second insulating material includes depositing the second insulating material over the array at least in a contact area, and etching the second insulating material to a level below the top of the formations.

Moreover, in accordance with a preferred embodiment of the present invention, the first insulating material is oxide.

Still further, in accordance with a preferred embodiment of the present invention, the second insulating material is nitride or oxy-nitride.

Moreover, in accordance with a preferred embodiment of the present invention, the removing of the first insulating material is performed by etching until a level of said bit lines.

Still further, in accordance with a preferred embodiment of the present invention, the forming of the self-aligned contact holes includes having column-like formations of a first insulating material previously deposited over the bit lines, depositing a liner of the second insulating material across the formations of the first insulating material and the spaces between the formations, filling the gaps in the liner with HV CMOS spacers, removing the liner to form wedge-topped spacers abutting the formations on each side, depositing an insulator fill, and removing the formations of the first insulating material and the insulator fill above the formations until the level of the bit lines.

Moreover, in accordance with a preferred embodiment of the present invention, the removing of the liner employs a removing substance to which the first insulating material is resistant.

Still further, in accordance with a preferred embodiment of the present invention, the substance employed to remove the liner is an etchant.

Moreover, in accordance with a preferred embodiment of the present invention, the insulator fill is either the first insulating material or an insulating material having similar etching properties to the first insulating material.

There is also provided, in accordance with a preferred embodiment of the present invention, an NVM array comprising a plurality of bit lines, and a multiplicity of contacts, each of which connect one metal line to one of the bit lines, and wherein a distance between the neighboring bit lines does not include a margin for contact misalignment.

There is also provided, in accordance with a preferred embodiment of the present invention, an NVM array comprising a plurality of bit lines, a plurality of word lines crossing the bit lines, wherein the word lines are grouped into word line areas and wherein segments of the bit lines located in the word line areas are covered with insulator formations, contact areas between neighboring word line areas, and contacts on the bit lines in the contact areas aligned with the formations in the word line areas.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
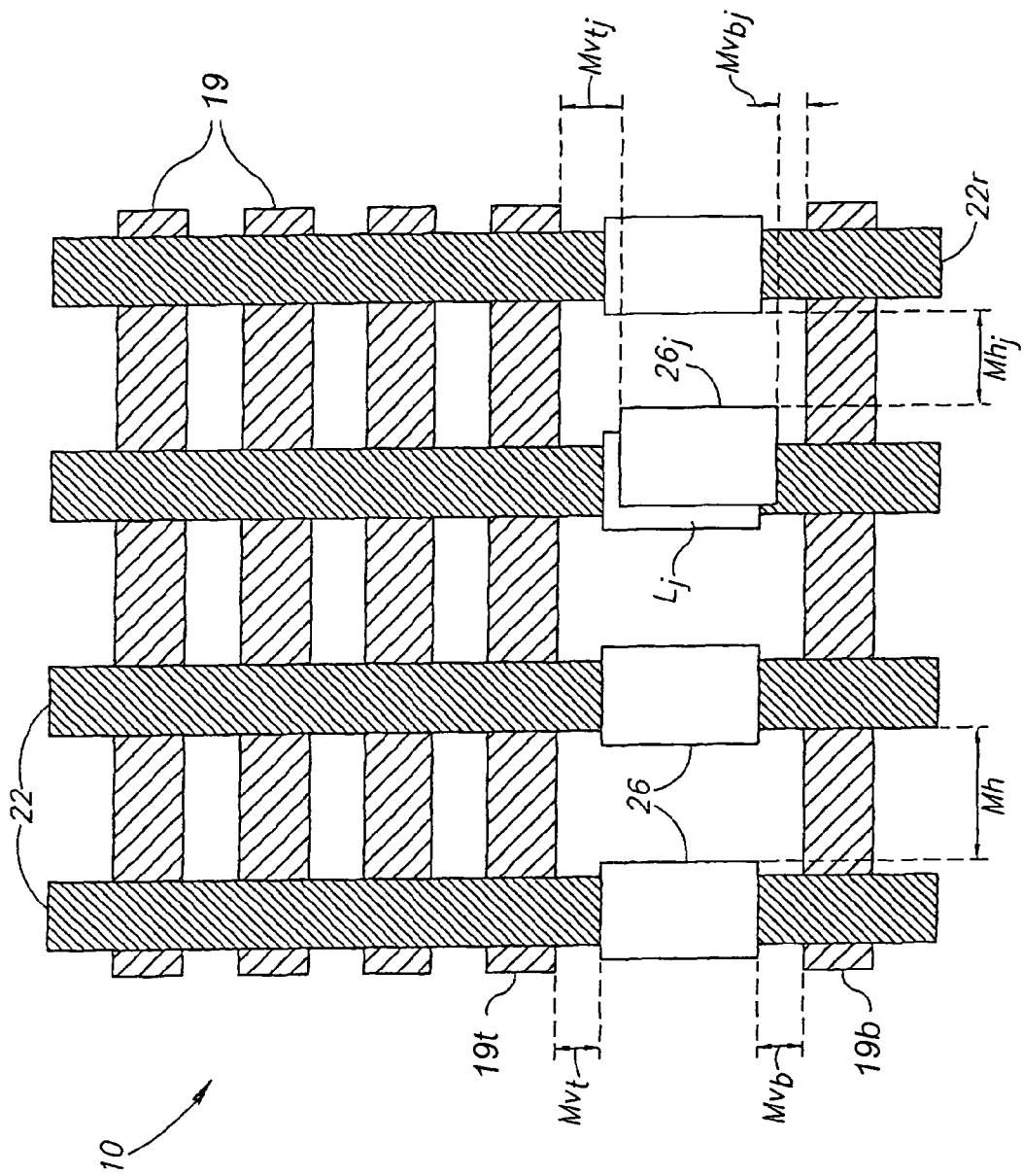
FIG. 1 is a schematic illustration of a dense planar virtual ground (VG) NROM array, composed of double polysilicon planar NROM cells.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Applicant has realized that die size benefits in a VG NROM array may be realized by minimizing the dimensions of required margins between contacts and the bit lines adjacent to them.

Applicant has further realized that achieving a high degree of certainty in the placement of contacts in direct alignment with the bit lines may foster the circumstances in which the dimensions of these required margins may be minimized. When contacts are reliably placed in direct alignment with the bit lines, the existing margins between the bit lines may be fully effective over their entire lengths. It may then be unnecessary to add additional margins to compensate for the reduction of effective distance between bit lines caused by contact misalignment.

Applicant has further realized that the manufacture of NROM cells in VG NROM arrays 10 may be undertaken in such a way as to make the step of contact placement self-aligning, thus achieving a high degree of certainty in the placement of contacts in direct alignment with the bit lines. Required margins between contacts and bit lines may thus be minimized, and a reduction in the area penalty of array contacts may thus be realized.

The self-aligned contact placement process disclosed in the present invention is illustrated schematically in FIGS. 2A, 2B, 2C and 2D, reference to which is now made. FIG. 3, reference to which is now also made, illustrates the method steps for the process illustrated in FIGS. 2A-2D in the form of a flow chart.

Figure 2A:
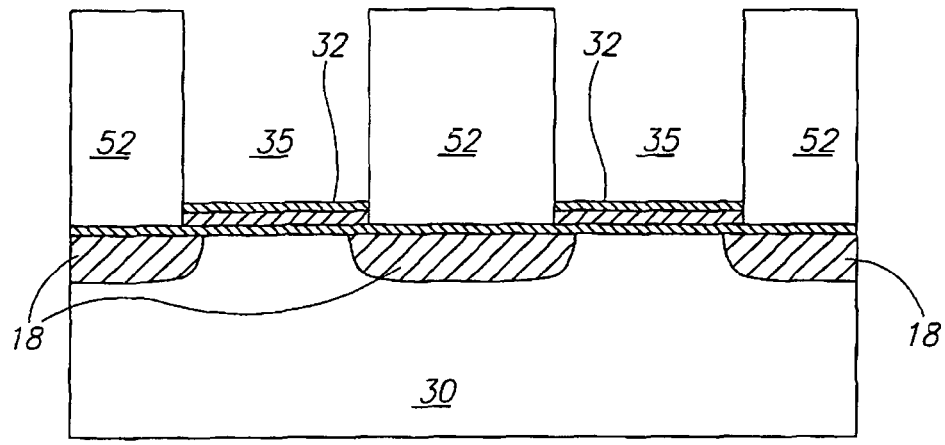
FIGS. 2A, 2B, 2C, and 2D are schematic illustrations of progressive stages in the manufacturing method of a novel memory array.
Figure 3:
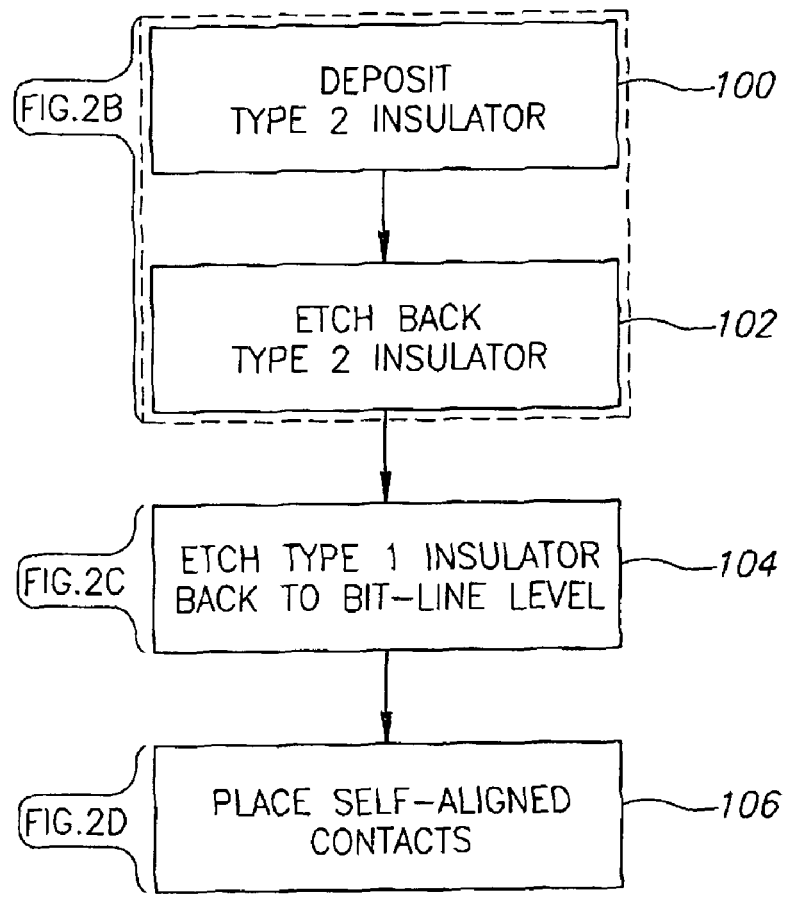
FIG. 3 is a flow chart illustration of the manufacturing method illustrated in FIGS. 2A-2D.

FIG. 2A shows a representative section Sw of array 10. Section Sw is taken through array 10 parallel to word lines 19 (FIG. 1), in an area of the array designated for the placement of contacts 26. As stated previously in the Background, a row of contacts 26 is typically located every 16 to 32 word lines.

The structure of section Sw, as shown in FIG. 2A, consists of a substrate layer 30 in which bit lines 18 have been implanted. Each of bit lines 18 is covered by a column-like formation 52 of a Type 1 insulator (such as, but not limited to oxide), and the spaces 35 between bit lines 18 are covered only with an oxide-nitride-oxide (ONO) layer 32.

FIG. 2A shows section Sw in its initial state with respect to the process disclosed in the present invention. As described in U.S. patent application Ser. No. 11/247,733, which discloses the manufacturing process of double polysilicon planar NROM cells, such as those comprising array 10, Section Sw arrives at the state illustrated in FIG. 2A subsequent to the manufacturing method step in which the polysilicon layer is etched into word lines.

Figure 2B:
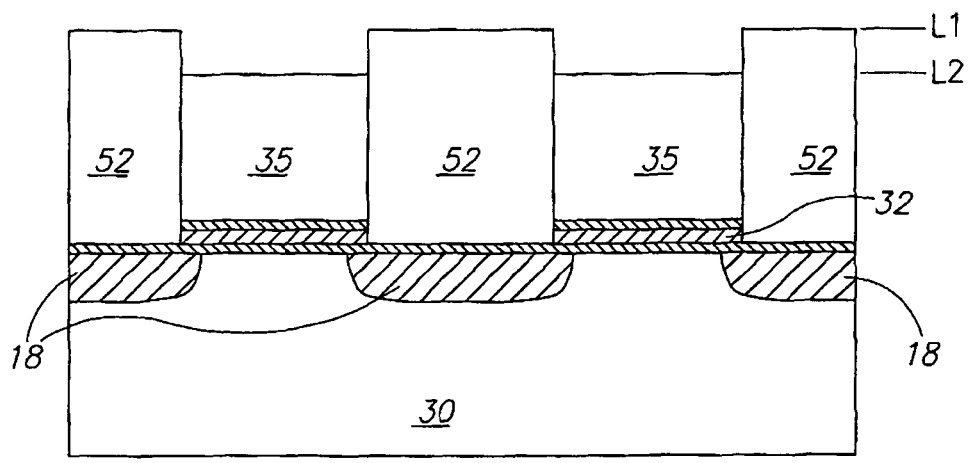

FIG. 2B shows the structure of section Sw subsequent to the first two method steps (step 100 and step 102) of the self-aligned contact placement process disclosed in the present invention. In method step 100, as shown in FIGS. 2B and 3, a Type 2 insulator, such as, but not limited to, nitride or oxy-nitride, which is highly resistant to the etch of the Type 1 insulator, may be deposited in spaces 35. In the following method step, step 102, the Type 2 insulator may be etched back to level L2, located 10-20 nm below level L1, the topmost level of the Type 1 insulator.

Figure 2C:
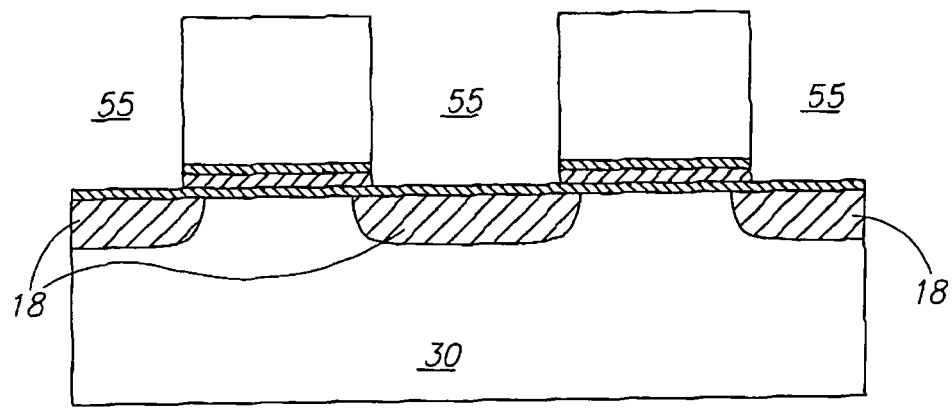
Figure 2D:
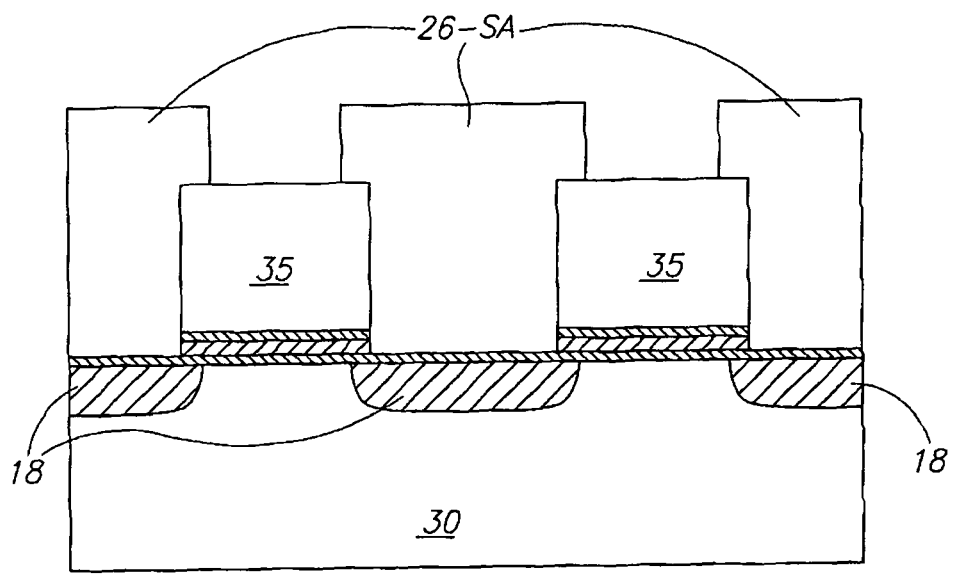

FIG. 2C shows the structure of section Sw subsequent to method step 104, during which an etchant which only attacks the Type 1 insulator is used to etch the column-like formations 52 of Type 1 insulator back to the level of bit lines 18. As shown in FIG. 2C, contact holes 55 which are self-aligned to the diffusion bit lines are thereby formed. FIG. 2D shows the final outcome after method step 106, during which self-aligned contacts 26-SA are placed in self-aligned contact holes 55.

In an additional preferred embodiment of the present invention, a thick liner of the Type 2 insulator may be used to achieve self-aligned contacts, as described with respect to FIGS. 4A, 4B, 4C and 4D, reference to which is now made. FIG. 5, reference to which is now also made, illustrates the method steps for the process illustrated in FIGS. 4A-4D in the form of a flow chart.

FIGS. 4A-4D show the progressive changes in the structure of a representative section Sw, previously introduced in FIG. 2A, as the method steps illustrated in FIG. 5 are performed on a VG NROM array 10 through which section Sw is taken. The initial state of section Sw in this embodiment is as shown in FIG. 2A.

Figure 4A:
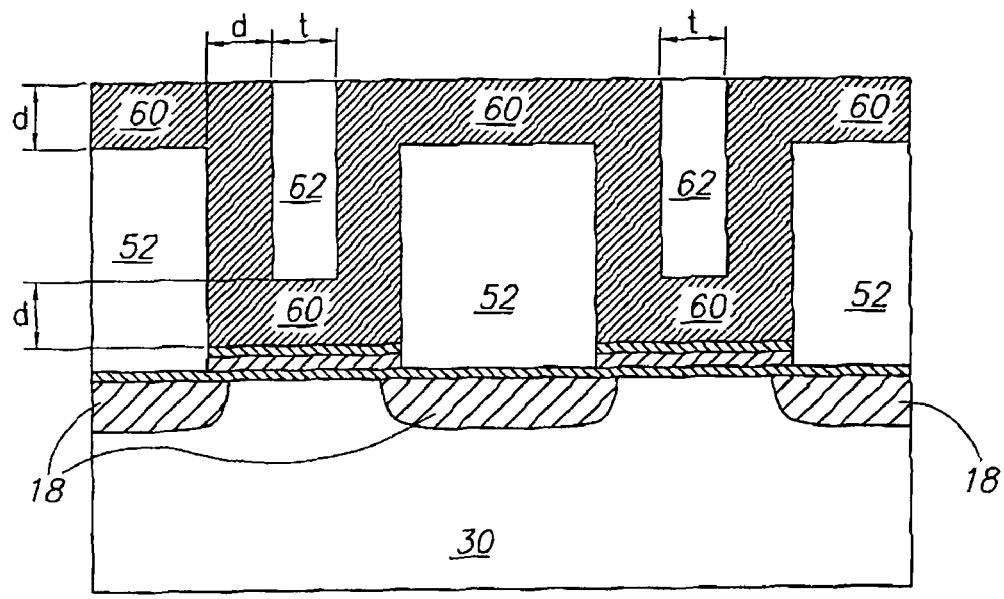
FIGS. 4A, 4B, 4C, and 4D are schematic illustrations of progressive stages in an alternative embodiment of the manufacturing method illustrated in FIGS. 2A-2D and FIG. 3.
Figure 5:
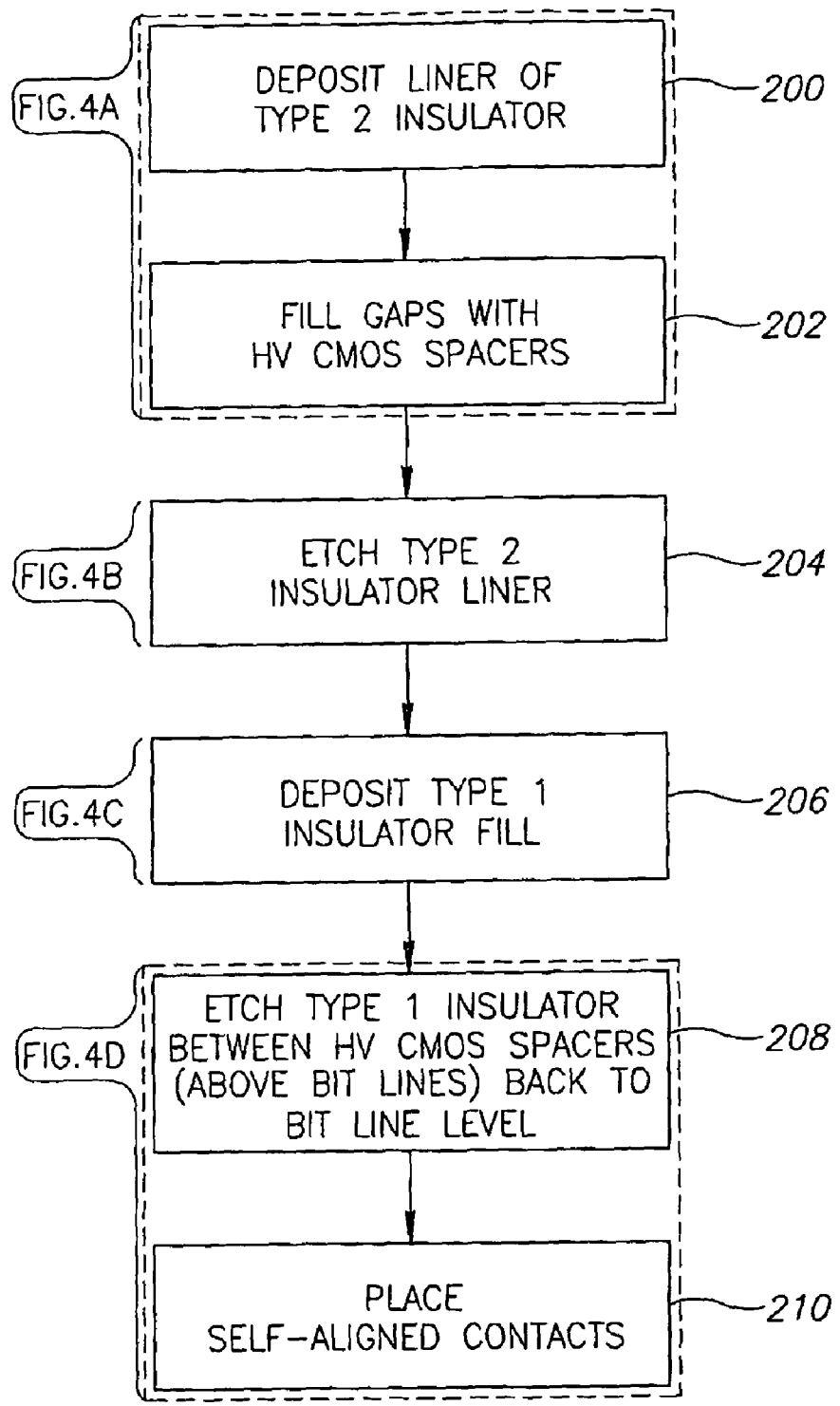
FIG. 5 is a flow chart illustration of the manufacturing method illustrated in FIGS. 4A-4D.

FIG. 4A shows the structure of section Sw subsequent to the first two method steps (step 200 and step 202) of the self-aligned contact placement process disclosed in an alternative embodiment of the present invention. In method step 200, as shown in FIGS. 4A and 5, a liner 60 of Type 2 insulator (such as, but not limited to, a nitride liner or an oxy-nitride liner), which is highly resistant to the etch of the Type 1 insulator, may be deposited in a layer of depth d across column-like formations 52 and the spaces 35 between bit lines 18. In accordance with the present invention, depth d may be at least 20 nm. In the following method step, step 202, thick HV CMOS spacers 62 may be used to fill the gaps in the array area. The thickness t of spacers 62 may correspond to the thickness of the gaps in the array area. An exemplary thickness of thickness t may be as wide as 40 nm. However, greater and lesser thicknesses are also included in the present invention.

Figure 4B:
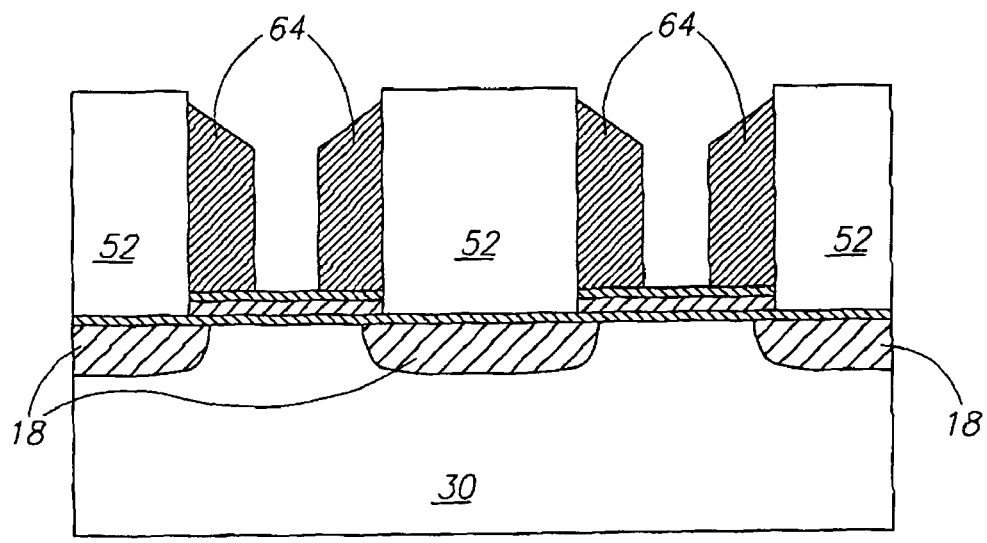

FIG. 4B shows the structure of section Sw subsequent to method step 204, during which Type 2 insulator liner 60 is etched. The portions of Type 2 insulator liner 60 remaining after the etch may have the form of wedge-topped spacers 64, abutting Type 1 insulator column-like formations 52 on each of their sides.

Figure 4C:
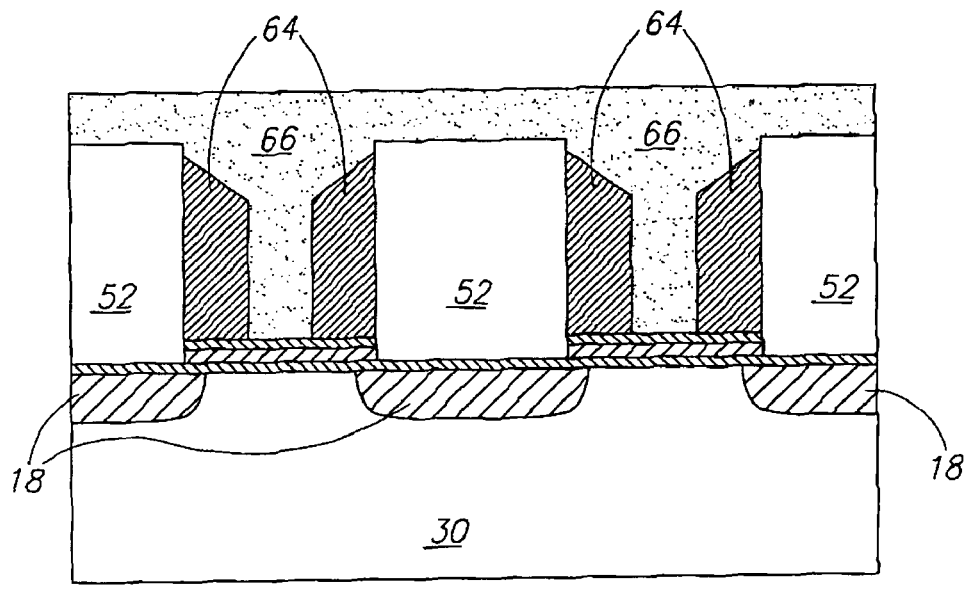

FIG. 4C shows the structure of section Sw subsequent to method step 206, during which a Type 1 insulator fill 66 is deposited. It will be appreciated that insulator fill 66 may not be a Type 1 insulator, but may have similar or suitable etching properties.

Figure 4D:
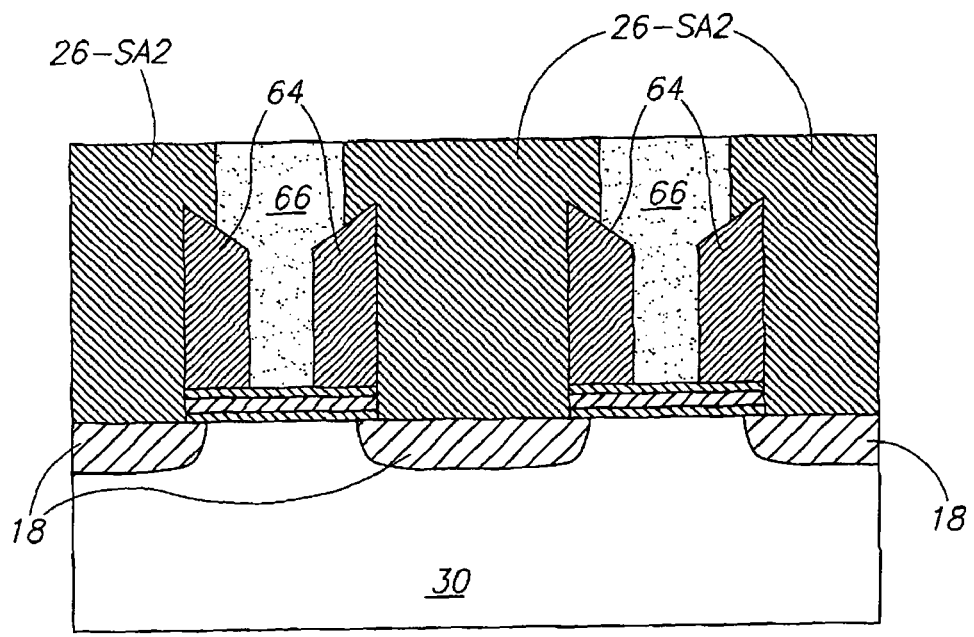

FIG. 4D shows the structure of section Sw subsequent to method steps 208 and 210. During method step 208, an etchant which only attacks the Type 1 insulator is used to etch through fill 66 and the column-like formations 52 of Type 1 insulator to the level of bit lines 18. Contact holes which are self-aligned to the diffusion bit lines are thereby formed, and self-aligned contacts 26-SA2 may be accurately placed in alignment with the diffusion bit lines in accordance with method step 210.

Figure 4E:
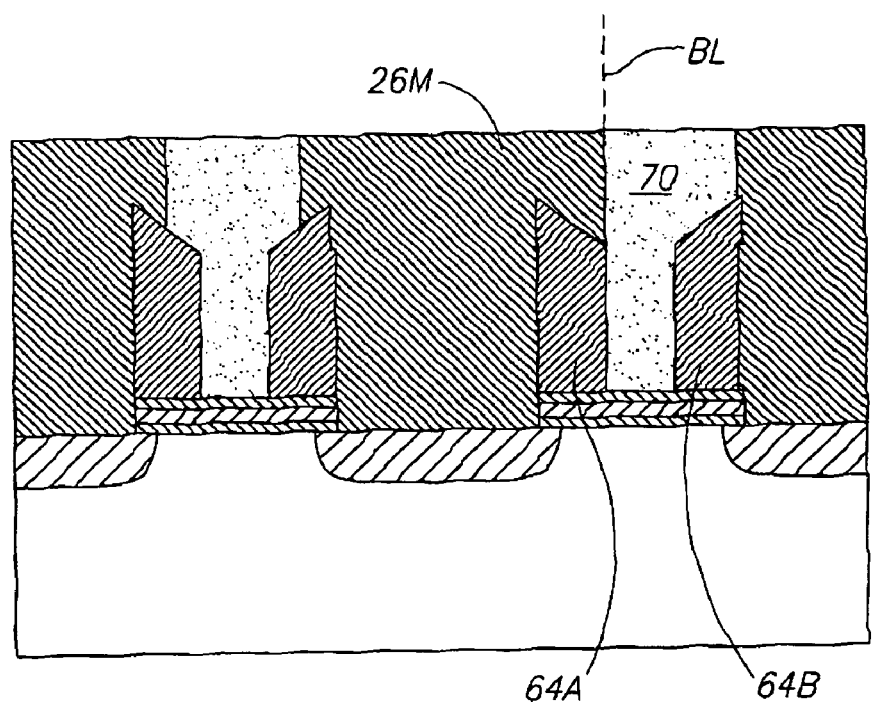
FIG. 4E is a schematic illustration of a slightly variant result of the manufacturing method illustrated in FIG. 4D.

It will be appreciated that nitride spacers 64 force the alignment of contacts 26 to the diffusion bit lines even when there is a slight misalignment. This is illustrated in FIG. 4E, reference to which is now made. In FIG. 4E, misaligned contact 26m is shown to be on the verge of 'spilling over' into area 70 between spacers 64a and 64b. However, it may be seen that the effusion of contact 26m is stopped at boundary line BL, the rightmost edge of spacer 64a.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A non-volatile memory ("NVM") device comprising:
a set of non-volatile memory cells disposed between and above two diffusion bit-lines, wherein at least one of the diffusion bit-lines is partially covered and in contact with a first insulator material and also partially covered and in contact with a second insulator material, wherein the first and second insulator materials are different; an etched contact hole passing from a top surface of the first insulator material through to the at least one of the diffusion bit-lines, wherein the etched contact hole is formed by using an etching agent with which the second insulator material substantially does not react; a first set of word-lines, wherein each of the word-lines in the first set is disposed across a group of adjacent cells; and, a second set of word-lines parallel to the first set of word-lines, wherein there is spacing between the first and second sets of word-lines which does not include any word-lines, wherein the etched contact hole is located within the spacing between the first and second sets of word-lines.

2. The NVM device according to claim 1, wherein the second insulator material covers portions of the diffusion bit-line substantially at and around a border between said diffusion bit-line and a substrate of the device.

3. The NVM device according to claim 2, further comprising an electrically conducting contact to the diffusion bit-line in the etched contact hole, which contact is blocked from contacting the substrate by the second insulator material.

* * * * *